(12) United States Patent
Ikeda (10) Patent No.: US 10,263,538 B2
(45) Date of Patent: Apr. 16, 2019

(54) SEMICONDUCTOR DEVICE AND POWER CONVERSION DEVICE

(71) Applicant: KABUSHIKI KAISHA TOSHIBA, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/424,122

(22) Filed: Feb. 3, 2017

(65) Prior Publication Data

US 2018/0019686 A1 Jan. 18, 2018

(30) Foreign Application Priority Data

Jul. 12, 2016 (JP) .................. 2016-137390

(51) Int. Cl.

| | |
|---|---|
| H03K 3/00 | (2006.01) |
| H02M 7/537 | (2006.01) |
| H01L 29/78 | (2006.01) |
| H03K 17/16 | (2006.01) |
| H01L 27/06 | (2006.01) |
| H01L 49/02 | (2006.01) |
| H01L 29/06 | (2006.01) |
| H01L 29/16 | (2006.01) |
| H01L 29/20 | (2006.01) |
| H01L 29/872 | (2006.01) |

(52) U.S. Cl.
CPC ........ *H02M 7/537* (2013.01); *H01L 27/0629* (2013.01); *H01L 28/10* (2013.01); *H01L 28/20* (2013.01); *H01L 28/40* (2013.01); *H01L 29/0634* (2013.01); *H01L 29/16* (2013.01); *H01L 29/1608* (2013.01); *H01L 29/2003* (2013.01); *H01L 29/7801* (2013.01); *H01L 29/872* (2013.01); *H03K 17/162* (2013.01)

(58) Field of Classification Search
CPC ..... H01L 27/0629; H01L 28/10; H01L 28/20; H01L 29/0634; H01L 29/16; H01L 29/1608; H01L 29/003; H01L 29/7801; H01L 29/872; H02M 7/537; H03K 17/162
USPC .......................................... 327/109
See application file for complete search history.

(56) References Cited

U.S. PATENT DOCUMENTS

| 4,103,157 A | * | 7/1978 | Green | .................. | G02B 6/4204 |
| | | | | | 250/239 |
| 4,158,182 A | * | 6/1979 | Washburn | ............ | H03B 5/1203 |
| | | | | | 330/277 |

(Continued)

FOREIGN PATENT DOCUMENTS

| JP | 2002-118258 | 4/2002 |
| JP | 2010-51165 | 3/2010 |

(Continued)

*Primary Examiner* — Dinh T Le (74) *Attorney, Agent, or Firm* — Oblon, McClelland, Maier & Neustadt, L.L.P.

(57) ABSTRACT

A semiconductor device according to an embodiment includes a transistor including a first electrode, a second electrode, and a gate electrode, an electric resistance being electrically connected to the gate electrode, a diode including an anode being electrically connected to the first electrode and a cathode being electrically connected between the electric resistance and the gate electrode, and a capacitor being connected in parallel with the electric resistance.

14 Claims, 9 Drawing Sheets

(56) References Cited

U.S. PATENT DOCUMENTS

| | | | | |
|---|---|---|---|---|
| 4,235,544 A | * | 11/1980 | Yamada | G03B 17/24 |
| | | | | 396/180 |
| 5,642,251 A | * | 6/1997 | Lebbolo | H02H 3/087 |
| | | | | 361/115 |
| 6,304,137 B1 | * | 10/2001 | Pullen | H02M 1/44 |
| | | | | 330/10 |
| 7,605,495 B2 | * | 10/2009 | Achart | H02M 1/10 |
| | | | | 307/15 |
| 8,395,422 B2 | | 3/2013 | Ogawa et al. | |
| 9,543,940 B2 | * | 1/2017 | Wang | H03K 17/16 |

FOREIGN PATENT DOCUMENTS

| | | |
|---|---|---|
| JP | 2012-199763 | 10/2012 |
| JP | 2012231347 | * 11/2012 |
| JP | 5492518 | 3/2014 |
| JP | 5733627 | 4/2015 |

\* cited by examiner

SEMICONDUCTOR DEVICE AND POWER CONVERSION DEVICE

CROSS-REFERENCE TO RELATED APPLICATION

This application is based upon and claims the benefit of priority from Japanese Patent Application No. 2016-137390, filed on Jul. 12, 2016, the entire contents of which are incorporated herein by reference.

FIELD

Embodiments described herein relate generally to a semiconductor device and a power conversion device.

BACKGROUND

In field effect transistors that perform a switching operation at a high speed, there are cases in which unexpected oscillation may occur in a gate voltage. If oscillation of the gate voltage occurs, there is a problem in that a circuit including the field effect transistor is likely to malfunction.

DETAILED DESCRIPTION

The semiconductor device according to an embodiment includes a transistor including a first electrode, a second electrode, and a gate electrode, an electric resistance being electrically connected to the gate electrode, a diode including an anode being electrically connected to the first electrode and a cathode being electrically connected between the electric resistance and the gate electrode, and a capacitor being connected in parallel with the electric resistance.

Hereinafter, exemplary embodiments of the present invention will be described with reference to the appended drawings. In the following description, the same members or similar members are denoted by the same reference numerals, and description of members or the like described once will be appropriately omitted.

Also, in this specification, a "semiconductor device" is a concept including a power module in which a plurality of elements such as discrete semiconductors are combined or an intelligent power module in which a plurality of elements such as discrete semiconductors, a drive circuit for driving the elements and a self-protection function are integrated.

First Embodiment

A semiconductor device according to the present embodiment includes a transistor including a first electrode, a second electrode, and a gate electrode, an electric resistance being electrically connected to the gate electrode, a diode including an anode being electrically connected to the first electrode and a cathode being electrically connected between the electric resistance and the gate electrode, and a capacitor being connected in parallel with the electric resistance.

Figure 1:
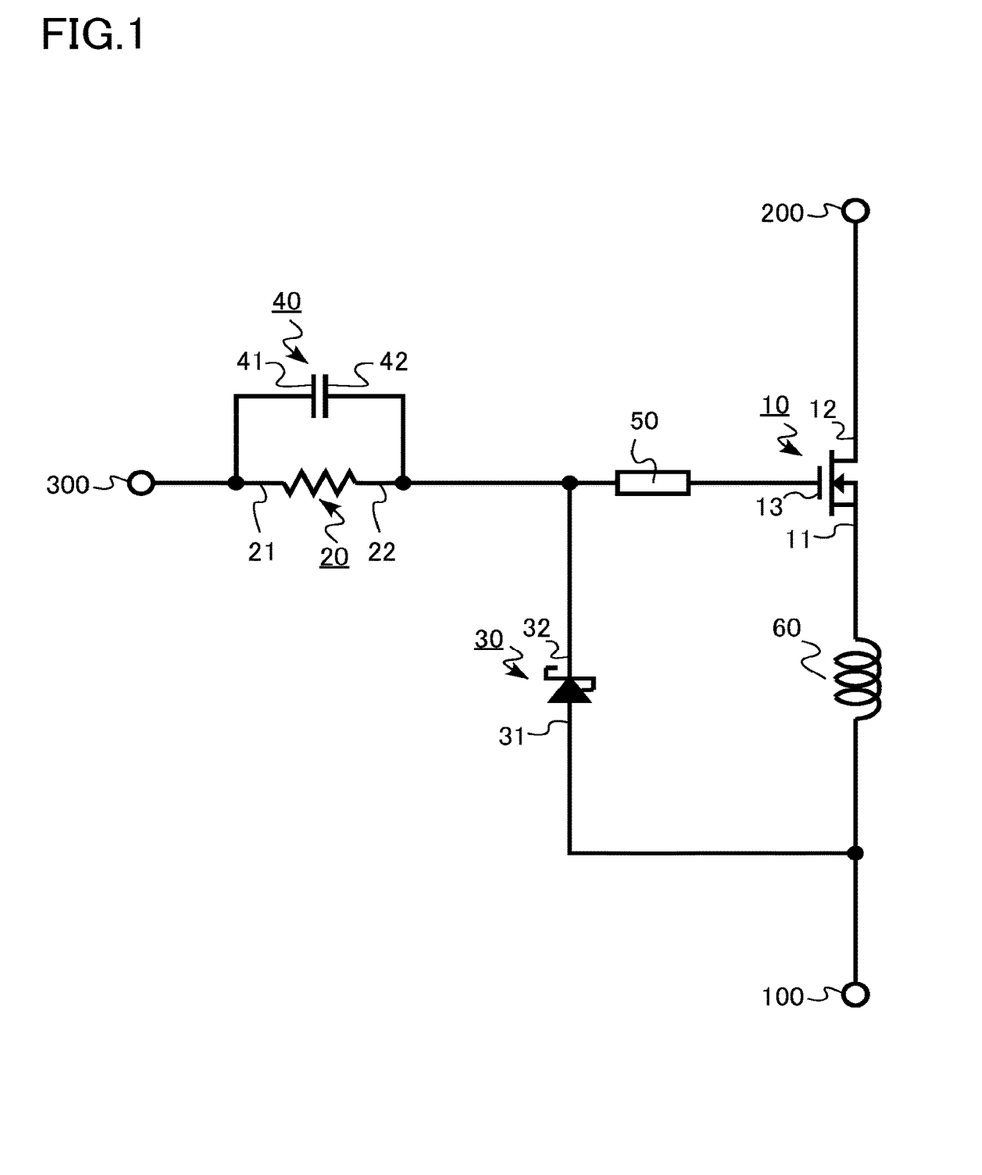
FIG. 1 is a circuit diagram illustrating a semiconductor device according to a first embodiment.

FIG. 1 is a circuit diagram illustrating a semiconductor device of the present embodiment.

The semiconductor device of the present embodiment includes a transistor 10, an electric resistance 20, a diode 30, a capacitor 40, a ferrite bead inductor 50, and a parasitic inductance 60. The semiconductor device further includes a source terminal 100, a drain terminal 200, and a gate terminal 300.

The transistor 10 includes a source electrode 11 (a first electrode), a drain electrode 12 (a second electrode), and a gate electrode 13. The source electrode 11 is electrically connected to the source terminal 100. The drain electrode 12 is electrically connected to the drain terminal 200. The gate electrode 13 is electrically connected to the gate terminal 300.

The source terminal 100 is fixed to, for example, a ground potential. For example, a positive voltage is applied to the drain terminal 200. A gate signal for switching an on state and an off state of the transistor 10 is applied to the gate terminal 300.

The transistor 10 is, for example, a field effect transistor (FET). The transistor 10 is, for example, a metal oxide semiconductor field effect transistor (MOSFET) of a super junction structure which has a rated voltage of 600 V or higher and uses silicon. For example, an FET using a nitride semiconductor or a MOSFET using silicon carbide may be used as the transistor 10.

The time rate of change of an electric current flowing between the drain electrode 12 and the source electrode 11 of the transistor 10 is, for example, 206 A (ampere)/μsec (microseconds) or more. In other words, the time rate of change of the drain current of the transistor 10 is, for example, 206 A (ampere)/μsec (microseconds) or more.

The electric resistance 20 is electrically connected to the gate electrode 13. The electric resistance 20 has a first end portion 21 and a second end portion 22. The second end portion 22 is electrically connected to the gate electrode 13 of the transistor 10. The first end portion 21 is electrically connected to the gate terminal 300.

The electric resistance 20 is a so-called gate resistance. The electric resistance 20 suppresses an abrupt variation of the gate voltage of the transistor 10.

The diode 30 has an anode 31 and a cathode 32. The anode 31 is electrically connected to the source electrode 11 of the transistor 10. The anode 31 is electrically connected to the source terminal 100. The cathode 32 is electrically connected between the electric resistance 20 and the gate electrode 13. The cathode 32 is connected between the second end portion 22 of the electric resistance 20 and the gate electrode 13 of the transistor 10.

When the gate voltage becomes a negative voltage, the diode 30 injects positive charges into the gate electrode 13 and suppresses the abruption variation of the gate voltage.

The diode 30 is, for example, a Schottky barrier diode.

The capacitor 40 is connected in parallel to the electric resistance 20. The capacitor 40 has a first capacitor electrode 41 and a second capacitor electrode 42. The first capacitor electrode 41 is electrically connected to the first end portion 21 of the electric resistance 20. The second capacitor electrode 42 is electrically connected to the second end portion 22 of the electric resistance 20.

The capacitor 40 has a function of suppressing the abrupt variation of the gate voltage through charging and discharging of the capacitor 40. A capacitance of the capacitor is, for example, equal to or less than ⅓ of an input capacitance of the transistor 10. The input capacitance is a sum of a capacitance Cgs between the gate and the source of the transistor 10 and a capacitance Cgd between the gate and the drain thereof.

The ferrite bead inductor 50 is provided between the electric resistance 20 and the gate electrode 13. The ferrite bead inductor 50 is electrically connected between the second end portion 22 of the electric resistance 20 and the gate electrode 13 of the transistor 10.

The ferrite bead inductor 50 functions as an electric resistance in the high frequency area to thereby absorb noise of the gate voltage and suppress the abruption variation of the gate voltage.

In this specification, the "ferrite bead inductor" is not limited to an inductor of a structure having a hollow cylindrical ferrite core. The "ferrite bead inductor" is a concept including all inductors using ferrite. For example, a chip ferrite bead inductor having a structure in which ferrite sheets on which wirings are printed are stacked is also included in the "ferrite bead inductor".

The parasitic inductance 60 exists between the anode 31 and the source electrode 11. The parasitic inductance 60 exists between the source electrode 11 and the source terminal 100. The parasitic inductance 60 is generated by, for example, a source lead of the transistor 10. The parasitic inductance 60 is generated by, for example, a bonding wire connecting the source electrode 11 of the transistor 10 with the source lead. The parasitic inductance 60 is generated, for example, by a wiring of a printed circuit board connected to the source electrode 11 of the transistor 10.

The parasitic inductance 60 is, for example, 10 nH or more and 30 nH or less.

Figure 2:
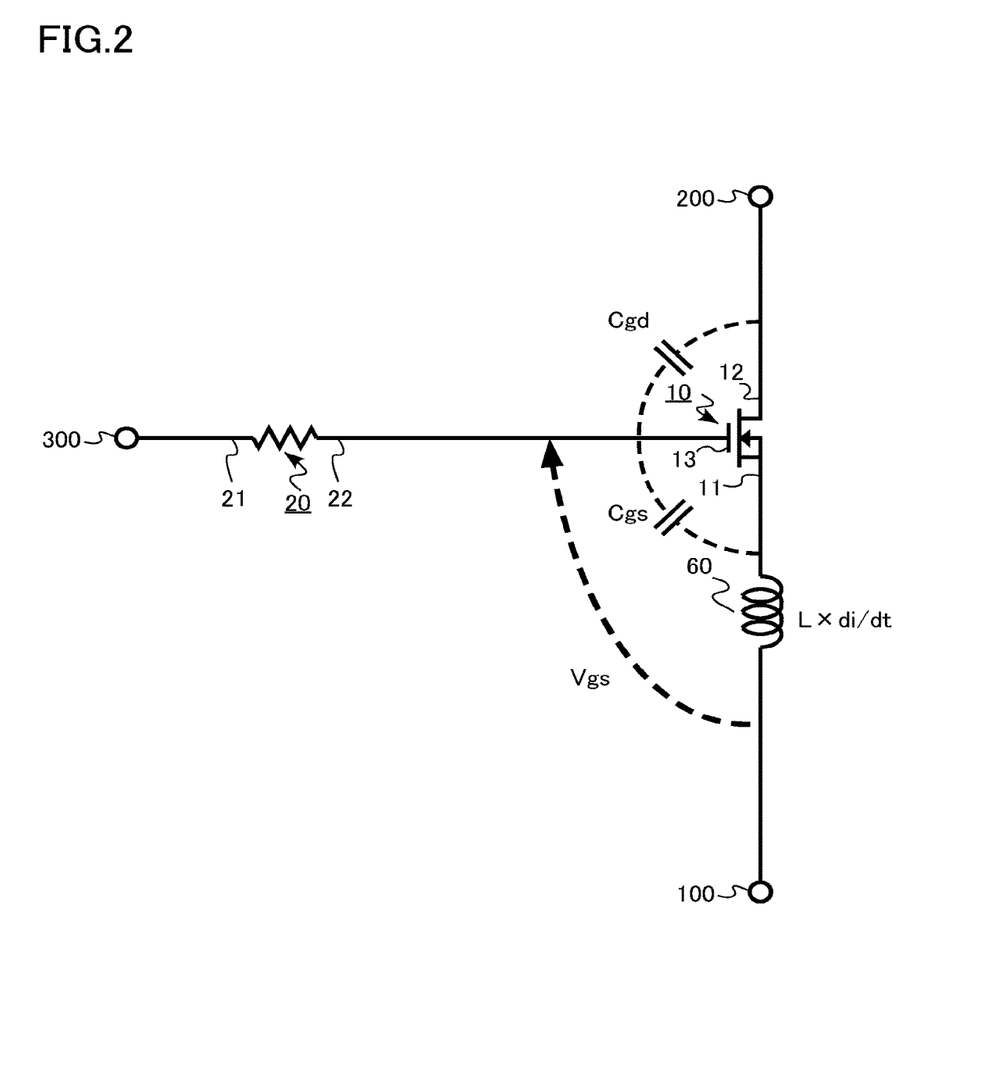
FIG. 2 is an explanatory diagram for describing a function and effect of the first embodiment.
Figure 3A:
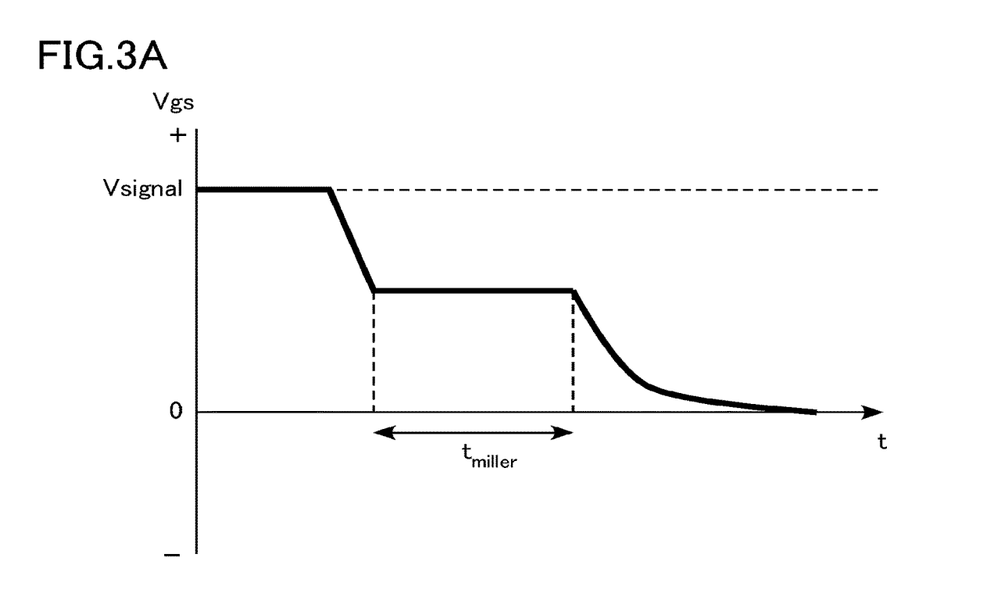
FIGS. 3A and 3B are explanatory diagrams for describing the function and effect of the first embodiment.
Figure 3B:
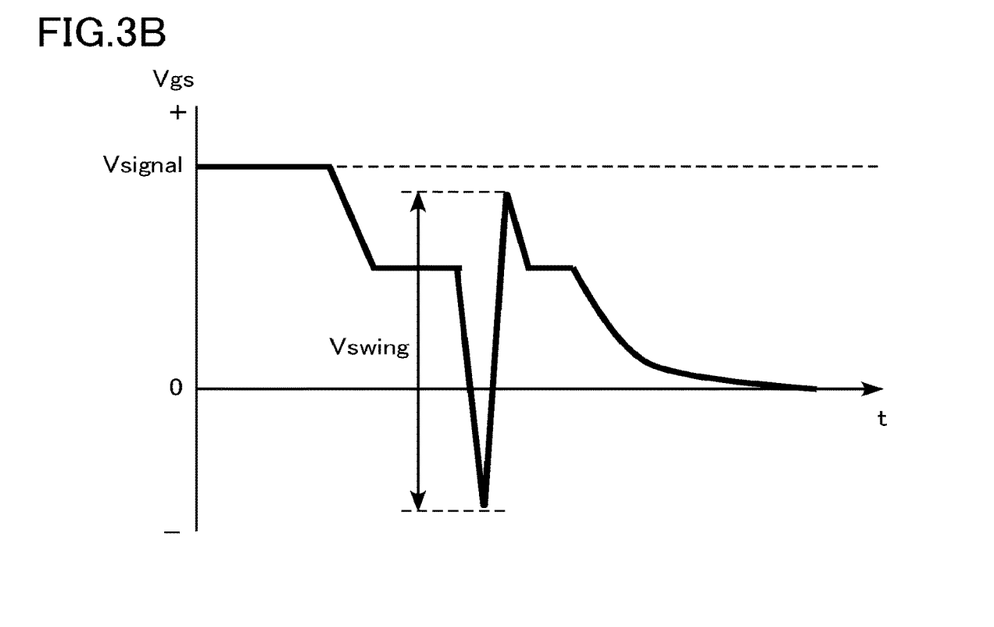

A function and effect of the present embodiment will be described below. FIG. 2 and FIGS. 3A and 3B are explanatory diagrams for describing the function and effect of the semiconductor device of the present embodiment.

The semiconductor device of the present embodiment includes the diode 30, the capacitor 40, and the ferrite bead inductor 50. The abrupt variation of the gate voltage when the transistor 10 is turned off can be suppressed through charging from the diode 30, charging and discharging of the capacitor 40, and the noise absorption of the ferrite bead inductor 50. Therefore, according to the semiconductor device of the present embodiment, oscillation of the gate voltage can be suppressed. This will be described below in detail.

FIG. 2 is a circuit diagram illustrating a semiconductor device of Comparative embodiment. The semiconductor device of Comparative embodiment differs from the semiconductor device of the present embodiment in that it does not include the diode 30, the capacitor 40, and the ferrite bead inductor 50.

FIGS. 3A and 3B are diagrams illustrating temporal change of the gate voltage in a turned-off state. A horizontal axis indicates an elapsed time, and a vertical axis indicates a gate voltage. FIG. 3A illustrates an ideal case, and FIG. 3B illustrates a case in which oscillation occurs in the gate voltage.

Referring to FIG. 2, when the transistor 10 is turned off, a voltage applied from the gate terminal 300 changes from Vsignal in an on state to 0 V. Ideally, the gate voltage Vgs in the gate electrode 13 completely becomes 0 V after a mirror period ($t_{miller}$ in FIG. 3A) in which the gate voltage Vgs is flat as illustrated in FIG. 3A. Charging and discharging of the gate-drain capacitance Vgd are performed during the mirror period.

Here, the gate voltage Vgs is voltage defined with voltage of the source terminal 100 as a reference. The source terminal 100 is, for example, fixed to the ground potential.

However, practically, there are cases in which oscillation occurs in the gate voltage Vgs as illustrated in FIG. 3B. The reason is considered as follows.

The parasitic inductance 60 exists in the source electrode 11. When the transistor 10 starts to be turned off, an induced electromotive force corresponding to a time change of the drain current is generated by the auto-induction of the parasitic inductance 60.

When the parasitic inductance 60 is indicated by L, and the time rate of change of the drain current is indicated by di/dt, and the induced electromotive force is indicated by L×di/dt. Due to the induced electromotive force generated in the parasitic inductance 60, the gate voltage Vgs is displaced in a negative direction as illustrated in FIG. 3B. Thereafter, the gate voltage Vgs becomes a negative voltage.

Then, when the transistor 10 is turned off, the drain voltage Vds increases, and the gate voltage Vgs is displaced in a positive direction due to capacitive coupling. As described above, the gate voltage Vgs oscillates.

A voltage difference between a negative peak and a positive peak of the gate voltage Vgs is referred to as an oscillation amplitude Vswing.

When the oscillation amplitude Vswing increases, noise occurs, and, for example, a circuit including the transistor is likely to malfunction.

In the semiconductor device of the present embodiment, when the gate voltage Vgs becomes a negative voltage, positive charges are injected into the gate electrode 13 from the source terminal 100 via the diode 30. Accordingly, the gate voltage Vgs is suppressed from becoming the negative voltage.

Further, when the gate voltage Vgs is displaced in the positive direction, the increase in the gate voltage Vgs is suppressed by charging and discharging of the capacitor 40. Even when the gate voltage Vgs is displaced in the negative direction, the drop of the gate voltage Vgs is suppressed by charging and discharging of the capacitor 40.

Due to the interaction between the diode 30 and the capacitor 40, the oscillation amplitude Vswing becomes smaller than when the diode 30 and the capacitor 40 are separately connected to the gate electrode 13. This is because the capacitor 40 having a fast response speed performs a function of suppressing the variation at the initial stage in which the gate voltage Vgs starts to be displaced in the negative direction, and the diode 30 having a high charging capability performs a function of suppressing a subsequent variation in the negative direction, and thus a maximum value of the displacement of the gate voltage Vgs on the negative side is consequently suppressed.

In the semiconductor device of the present embodiment, the oscillation of the gate voltage Vgs is suppressed by the above-described functions. Further, according to the present embodiment, when the oscillation of gate voltage Vgs is suppressed, switching loss, particularly, turn-off loss is suppressed at the same time.

In the semiconductor device of the present embodiment, further, the oscillation of the gate voltage Vgs is suppressed by the ferrite bead inductor 50 absorbing the noise of gate voltage Vgs.

In the present embodiment, it is desirable that the capacitance of the capacitor 40 be ⅓ or less of the input capacitance of the transistor 10. When the input capacitance exceeds this range, the capacitor 40 may function as a so-called speed-up capacitor. In this case, the noise of the gate voltage Vg may increase, and the oscillation suppression effect of the gate voltage Vgs by the capacitor 40 may be reduced.

Since the capacitance of the capacitor 40 is set to be ⅓ or less of the input capacitance of the transistor 10, the displacement of the gate electrode 13 caused by the charging and discharging of the capacitor 40 when the transistor 10 is turned on becomes a threshold voltage or less. Therefore, the capacitor 40 does not function as the speed-up capacitor. When the transistor 10 is turned off, similarly, the capacitor 40 does not function as the speed-up capacitor. Further, in a calculation of the boundary condition, the threshold voltage of the transistor 10 is assumed to be ¼ of the gate signal Vsignal.

From a point of view for preventing the capacitor 40 from functioning as the speed-up capacitor, the capacitance of the capacitor 40 is preferably ⅕ or less of the input capacitance of the transistor 10, and more preferably ¹⁄₁₀ or less of the input capacitance of the transistor 10.

The semiconductor device of the present embodiment effectively functions particularly when the induced electromotive force generated by the parasitic inductance 60 is large. The induced electromotive force $\Delta V$ generated by the parasitic inductance 60 is indicated by $\Delta V = L \times di/dt$. L indicates the parasitic inductance 60, and di/dt indicates the time rate of change of the drain current.

From the above point of view, the parasitic inductance 60 is preferably 10 nH or more, more preferably 15 nH or more, and further preferably 20 nH or more. For example, the parasitic inductance 60 can be measured through an LCR meter or a TDR measurement.

From the above point of view, the transistor 10 is preferably a transistor that performs switching at a high speed. For example, it is desirable that the time rate of change of the drain current flowing between the drain electrode 12 and the source electrode 11 be 206 A (ampere)/μsec (microseconds) or more.

In the calculation of the boundary condition, it is assumed that the threshold voltage of the transistor 10 is 2.5 V, a forward drop voltage of the diode 30 is 0.6 V, the parasitic inductance 60 is 15 nH, and the induced electromotive force in which the displacement of the gate voltage Vg in the negative direction exceeds 3.1 V is generated. That is, 3.1 V≤15 nH×di/dt is assumed.

The diode 30 is preferably a Schottky barrier diode. For example, the Schottky barrier diode has a lower forward drop voltage than a PIN diode. Therefore, it is possible to quickly start the injection of the positive charges into the gate electrode 13 via the diode 30.

As described above, according to the semiconductor device of the present embodiment, the oscillation of the gate voltage Vgs can be suppressed.

Second Embodiment

A semiconductor device of the present embodiment is similar to that of the first embodiment except that a diode is a PIN diode. Hereinafter, description of contents overlapping the first embodiment will be omitted.

Figure 4:
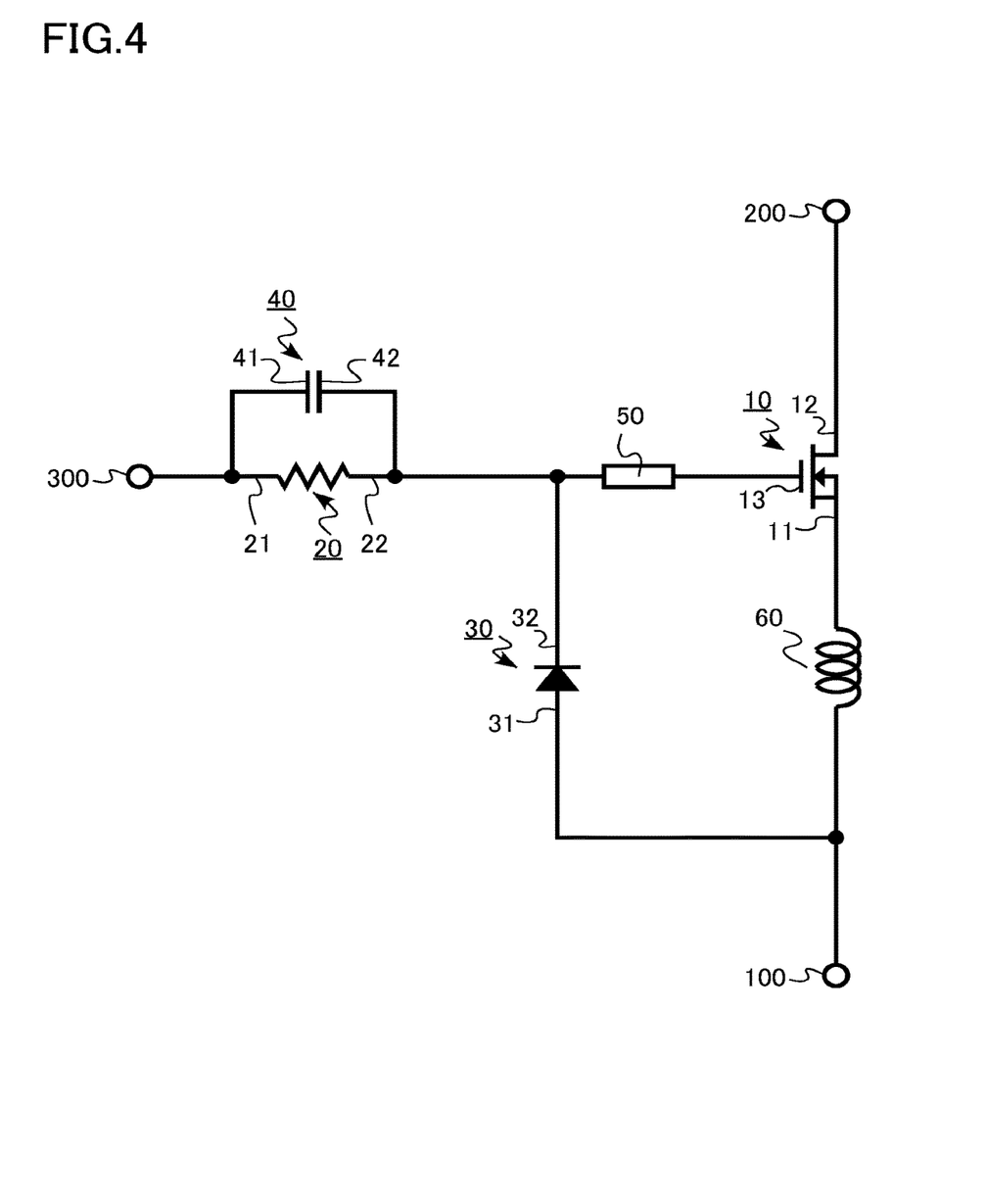
FIG. 4 is a circuit diagram illustrating a semiconductor device according to a second embodiment.

FIG. 4 is a circuit diagram illustrating a semiconductor device of the present embodiment. The semiconductor device of the present embodiment differs from that of the first embodiment in that the diode 30 is a PIN diode.

According to the semiconductor device of the present embodiment, it is possible to suppress the oscillation of the gate voltage Vgs, similarly to the first embodiment.

Third Embodiment

A semiconductor device of the present embodiment is similar to that of the first embodiment except that the ferrite bead inductor is not provided. Hereinafter, description of contents overlapping the first embodiment will be omitted.

Figure 5:
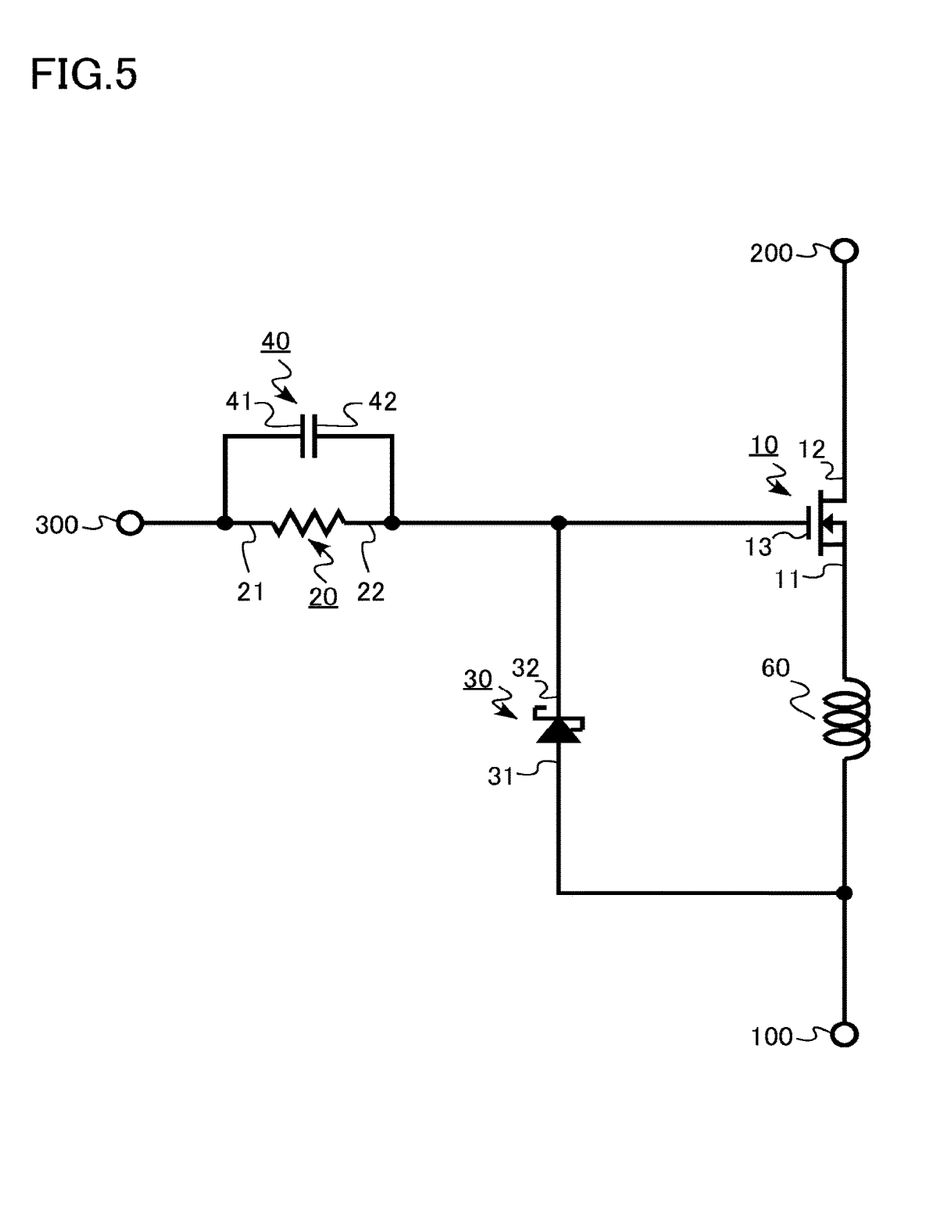
FIG. 5 is a circuit diagram illustrating a semiconductor device according to a third embodiment.

FIG. 5 is a circuit diagram illustrating the semiconductor device of the present embodiment. The semiconductor device of the present embodiment includes no ferrite bead inductor, unlike the first embodiment.

According to the semiconductor device of the present embodiment, it is possible to suppress the oscillation of the gate voltage Vgs, similarly to the first embodiment.

Fourth Embodiment

A semiconductor device of the present embodiment is similar to that of the first embodiment except that the ferrite bead inductor is electrically connected between the electric resistance and the cathode of the diode. Hereinafter, description of contents overlapping the first embodiment will be omitted.

Figure 6:
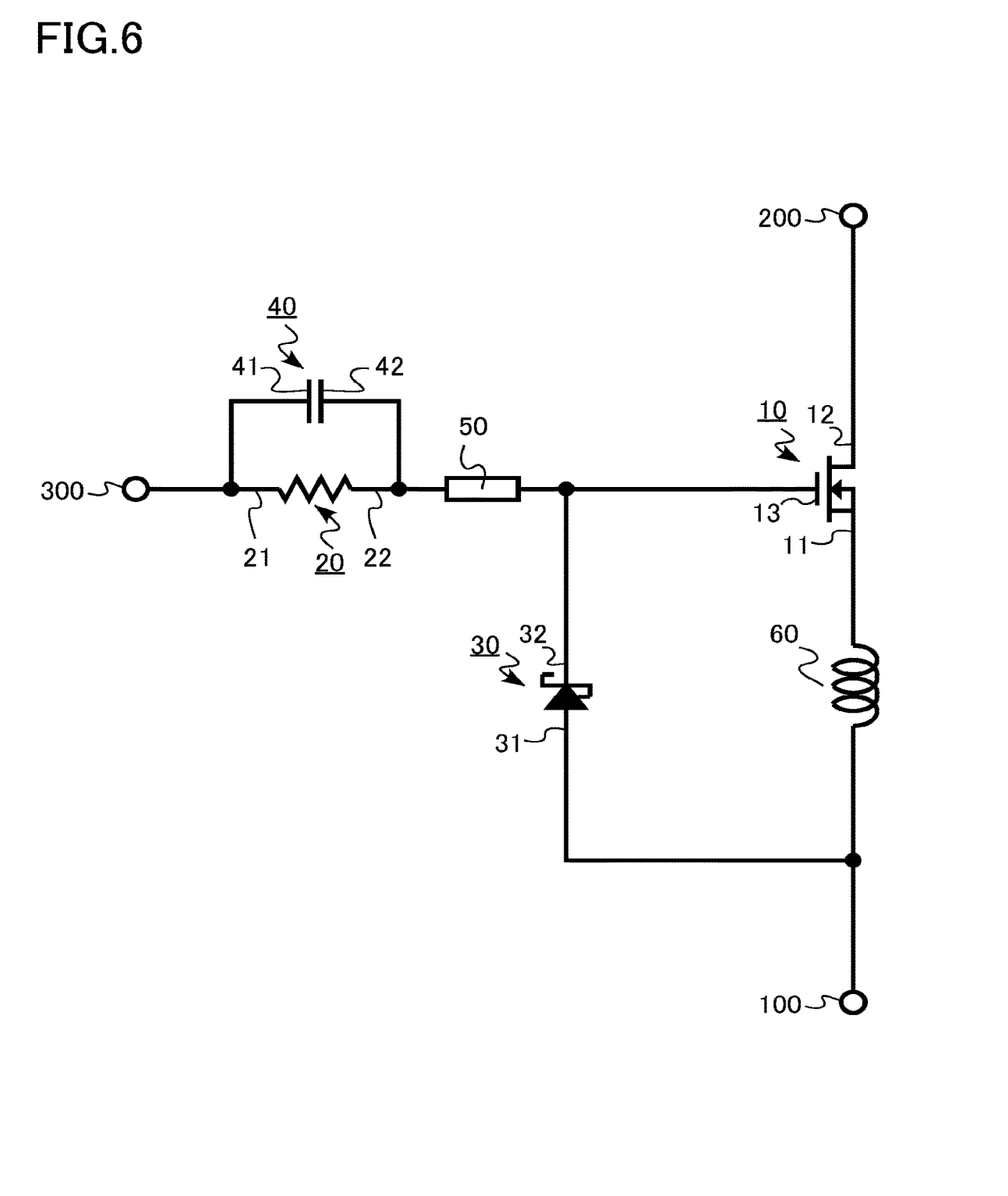
FIG. 6 is a circuit diagram illustrating a semiconductor device according to a fourth embodiment.

FIG. 6 is a circuit diagram illustrating the semiconductor device of the present embodiment.

The semiconductor device of the present embodiment differs from that of the first embodiment in that the ferrite bead inductor 50 is electrically connected between the electric resistance 20 and the cathode 32 of the diode 30. The ferrite bead inductor 50 is electrically connected between the second end portion 22 of the electric resistance 20 and the cathode 32 of the diode 30.

The cathode 32 of the diode 30 is connected to be closer to the gate electrode 13 than the ferrite bead inductor 50. Therefore, when gate voltage Vgs is displaced in the negative direction, the injection of the positive charges into the gate electrode 13 via the diode 30 is performed more quickly than in the first embodiment. Therefore, the oscillation of the gate voltage Vgs is further suppressed.

According to the semiconductor device of the present embodiment, it is possible to suppress the oscillation of the gate voltage Vgs, similarly to the first embodiment. Further, since the position of the ferrite bead inductor 50 is optimized, the oscillation of the gate voltage Vgs is further suppressed.

Fifth Embodiment

A semiconductor device of the present embodiment is similar to that of the first embodiment except that the capacitor is connected in parallel to the electric resistance and the ferrite bead inductor, and the cathode is electrically connected between the ferrite bead inductor and the gate electrode. Hereinafter, description of contents overlapping the first embodiment will be omitted.

Figure 7:
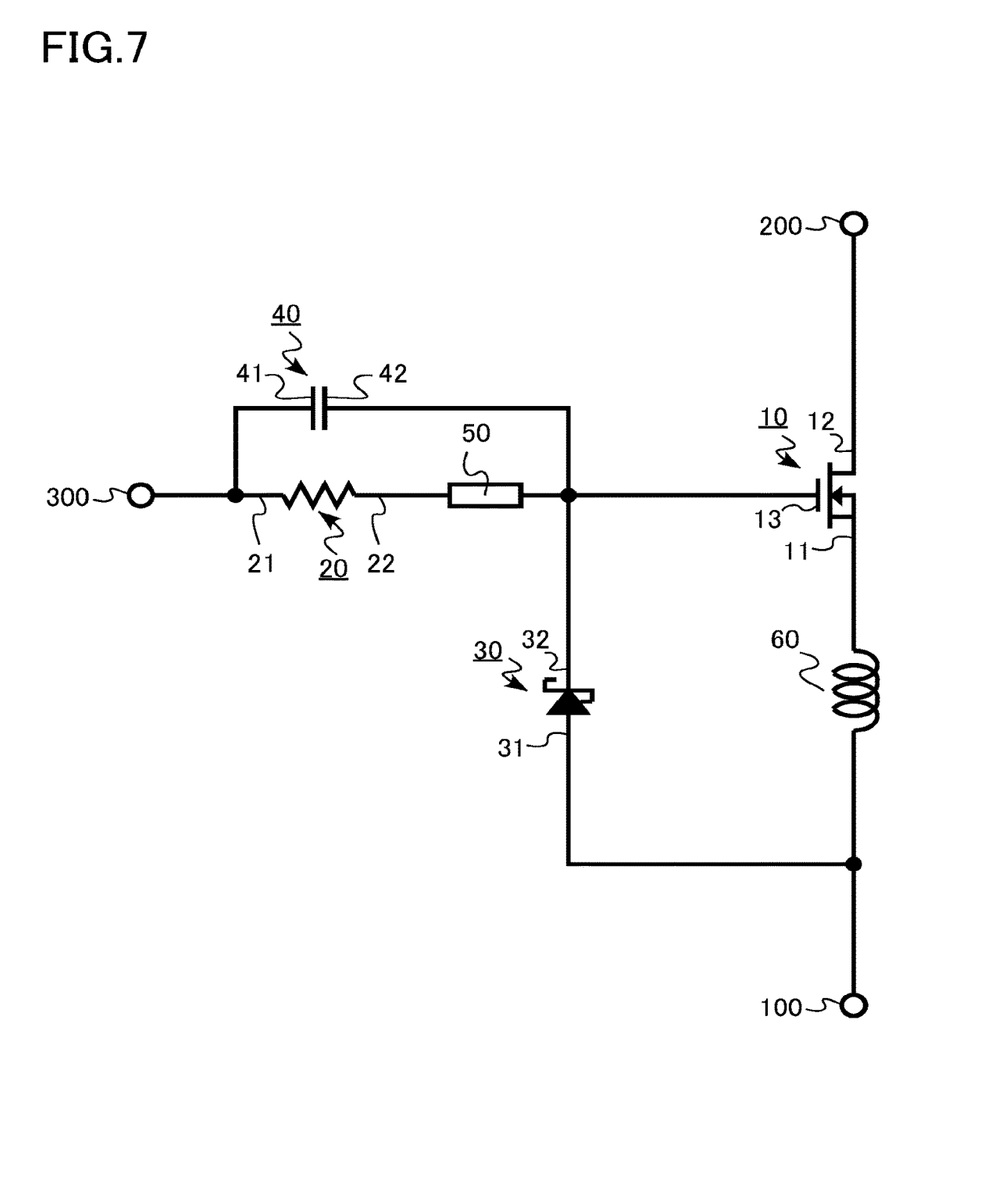
FIG. 7 is a circuit diagram illustrating a semiconductor device according to a fifth embodiment.

FIG. 7 is a circuit diagram illustrating the semiconductor device of the present embodiment.

The semiconductor device of the present embodiment differs from that the first embodiment in that the capacitor 40 is connected in parallel to the electric resistance 20 and the ferrite bead inductor 50. Further, the cathode 32 is electrically connected between the ferrite bead inductor 50 and the gate electrode 13.

The second end portion 22 of the electric resistance 20 is electrically connected to one end of the ferrite bead inductor 50. Further, the second capacitor electrode 42 of the capacitor 40 is electrically connected to the other end of the ferrite bead inductor 50.

The cathode 32 of the diode 30 is connected to a position closer to the gate electrode 13 than the ferrite bead inductor 50. Therefore, when gate voltage Vgs is displaced in the negative direction, the injection of the positive charges into the gate electrode 13 via the diode 30 is performed more quickly than in the first embodiment. Therefore, the oscillation of the gate voltage Vgs is further suppressed.

Further, the second capacitor electrode 42 of the capacitor 40 is connected to a position closer to the gate electrode 13 than the ferrite bead inductor 50. Therefore, when the gate voltage Vgs is displaced, the charging and discharging of the gate electrode 13 caused by the charging and discharging of the capacitor 40 are performed more quickly than in the first embodiment. Therefore, the oscillation of the gate voltage Vgs is further suppressed.

According to the semiconductor device of the present embodiment, it is possible to suppress the oscillation of the gate voltage Vgs, similarly to the first embodiment. Further, since the position of the ferrite bead inductor 50 is optimized, the oscillation of the gate voltage Vgs is further suppressed.

Sixth Embodiment

A power conversion device and a drive device of the present embodiment include the semiconductor device of the first embodiment.

Figure 8:
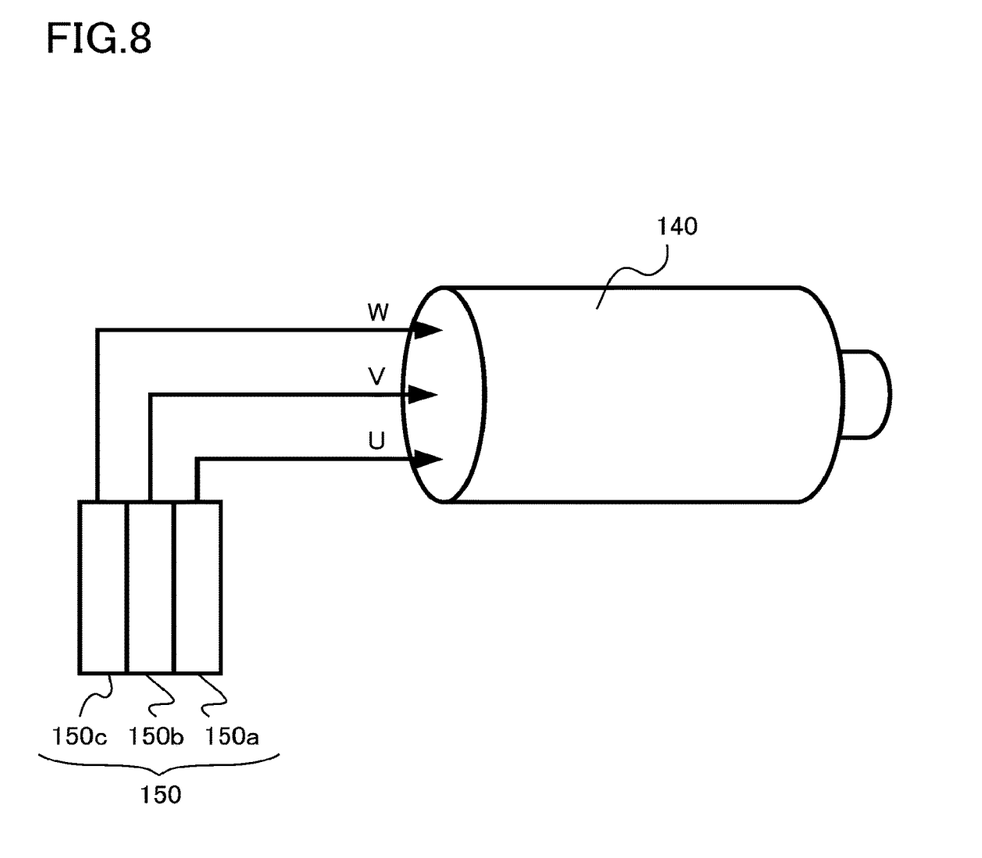
FIG. 8 is a schematic diagram illustrating a power conversion device and a drive device according to a sixth embodiment.

FIG. 8 is a schematic diagram illustrating the power conversion device and the drive device of the present embodiment. The drive device includes a motor 140 and an inverter 150 which is an example of the power conversion device.

The inverter 150 is configured with three semiconductor modules 150a, 150b, and 150c each of which uses the semiconductor device of the first embodiment as a switching device. The three semiconductor modules 150a, 150b, and 150c are connected in parallel, so that a three-phase inverter 150 having three AC voltage output terminals U, V, and W is achieved. The motor 140 is driven by an AC voltage output from the inverter 150.

According to the present embodiment, the semiconductor device in which the oscillation of the gate voltage Vgs is suppressed is provided, and thus it is possible to provide the inverter 150 and the drive device with improved characteristics.

EXAMPLES

Hereinafter, examples of the present invention will be described.

Example 1

Similarly to the first embodiment, a circuit configuration including the diode 30, the capacitor 40, and the ferrite bead inductor 50 was used. A Schottky barrier diode was used as the diode 30. The capacitance of the capacitor 40 was 100 pF. In this circuit configuration, the change in the gate voltage Vgs when the transistor 10 is turned off was measured.

Example 2

Similarly to the second embodiment, a circuit configuration including the diode 30, the capacitor 40, and the ferrite bead inductor 50 was used. A PIN diode was used as the diode 30. In this circuit configuration, the change in the gate voltage Vgs when the transistor 10 is turned off was measured.

Example 3

Similarly to the second embodiment, a circuit configuration including the diode 30, the capacitor 40, and the ferrite bead inductor 50 was used. A small signal PIN diode having a smaller rated current than in Example 2 was used as the diode 30.

Example 4

Similarly to the third embodiment, the ferrite bead inductor 50 was not used, and a circuit configuration including the diode 30 and the capacitor 40 was used. A Schottky barrier diode was used as the diode 30. In this circuit configuration, the change in the gate voltage Vgs when the transistor 10 is turned off was measured.

Comparative Example 1

Similarly to comparative embodiment of the first embodiment, a circuit configuration that does not include the diode 30, the capacitor 40, and the ferrite bead inductor 50 was used. In this circuit configuration, the change in the gate voltage Vgs when the transistor 10 is turned off was measured.

Comparative Example 2

A circuit configuration in which only the diode 30 is applied to Comparative Example 1, that is, a circuit configuration in which the capacitor 40 and the ferrite bead inductor 50 are excluded from the circuit configuration of Example 1 was used. A Schottky barrier diode was used as the diode 30. In this circuit configuration, the change in the gate voltage Vgs when the transistor 10 is turned off was measured.

Comparative Example 3

A circuit configuration in which only the capacitor 40 is applied to Comparative Example 1, that is, a circuit configuration in which the diode 30 and the ferrite bead inductor 50 are excluded from the circuit configuration of Example 1 was used. In this circuit configuration, the change in the gate voltage Vgs when the transistor 10 is turned off was measured.

Table 1 illustrates measurement results of Examples 1 to 4 and Comparative Examples 1 to 3. For Examples 1 to 4 and Comparative Examples 1 to 3, the oscillation amplitude Vswing (V) and a suppression width (V) of the oscillation amplitude relative to Comparative Example 1 are shown. The suppression width (V) of the oscillation amplitude is a difference in the oscillation amplitude. For Example 1 and Comparative Example 1, turn-off loss (μJ) is shown.

TABLE 1

|  | Oscillation amplitude (V) | Suppression width (V) | Turn-off loss (μJ) |
|---|---|---|---|
| Example 1 | 6.5 | 12.0 | 7.5 |
| Example 2 | 11.5 | 7.0 | n/a |
| Example 3 | 12.4 | 6.1 | n/a |
| Example 4 | 8.0 | 10.5 | n/a |
| Comparative Example 1 | 18.5 | n/a | 7.2 |
| Comparative Example 2 | 11.7 | 6.8 | n/a |
| Comparative Example 3 | 16.0 | 2.5 | n/a |

Figure 9A:
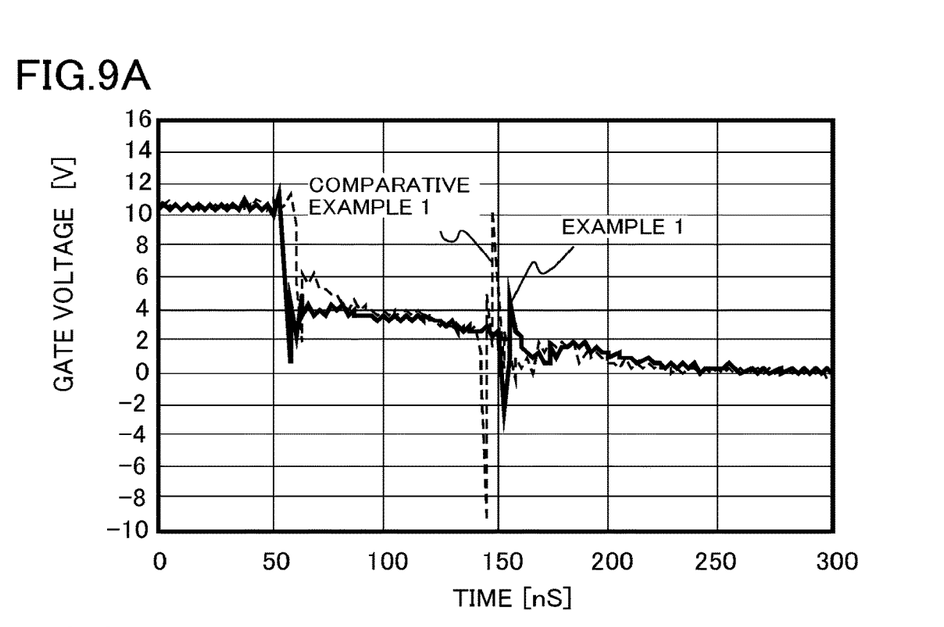
FIGS. 9A and 9B are diagrams illustrating temporal changes of a gate voltage and turn-off loss in a turned-off state in Example 1 and Comparative Example 1.
Figure 9B:
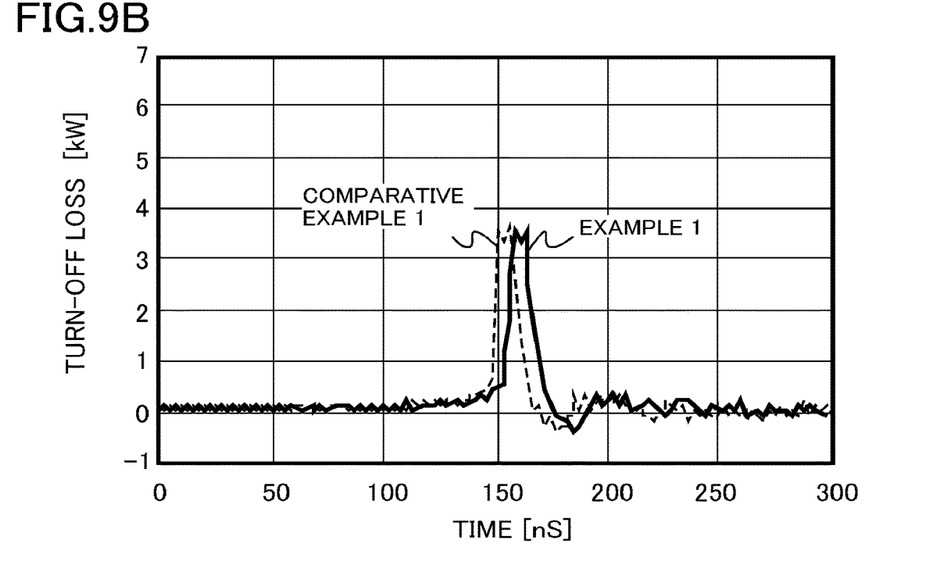

FIGS. 9A and 9B are diagrams illustrating temporal changes of the gate voltage and the turn-off loss in the turned-off state in Example 1 and Comparative Example 1. FIG. 9A illustrates the temporal change of the gate voltage, and FIG. 9B illustrates the temporal change of the turn-off loss. The turn-off loss of Table 1 is a time integral value of the turn-off loss of FIG. 9B.

In FIGS. 9A and 9B, Example 1 is indicated by a solid line, and Comparative Example 1 is indicated by a dotted line.

As is apparent from Table 1, in Examples 1 to 4 in which at least the diode 30 and the capacitor 40 are provided, the oscillation of the gate voltage Vgs is further suppressed than in Comparative Example 1 in which the diode 30, the capacitor 40, and the ferrite bead inductor 50 are not provided.

Further, when the suppression widths of Example 4 in which the diode 30 and the capacitor 40 are provided, Comparative Example 2 in which only the diode 30 is provided, and Comparative Example 3 in which only the capacitor 40 is provided are compared, it can be understood that in Example 4, an effect more than a combination of the effects of the diode 30 alone and the effect of the capacitor 40 alone is obtained. In other words, a sum of the suppression widths of the single elements is 9.3 V=6.8 V+2.5 V, whereas in Example 4, the suppression width of 10.5 V or more is obtained.

Further, when Example 1 in which the Schottky barrier diode is used as the diode 30 is compared with Examples 2 and 3 in which the PIN diode is used as the diode 30, it is clear that the oscillation suppression effect is large when the Schottky barrier diode is used.

Further, when Example 1 is compared with Example 4 in which the ferrite bead inductor 50 is excluded, it is clear that the oscillation suppression effect is large when the ferrite bead inductor 50 is used.

Furthermore, when Example 1 is compared with Comparative Example 1, the turn-off loss of Example 1 is equivalent to that of Comparative Example 1.

The first to fifth embodiments have been described in connection with the examples in which the transistor 10 is an FET, but for example, an insulated gate bipolar transistor (IGBT) can also be applied as the transistor 10.

The sixth embodiment has been described in connection with the example in which the inverter is described as the power conversion device, but a DC-DC converter can be applied as the power conversion device as well.

While certain embodiments have been described, these embodiments have been presented by way of example only, and are not intended to limit the scope of the inventions. Indeed, the semiconductor device and the power conversion device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a transistor including a first electrode, a second electrode, and a gate electrode;
   an electric resistance including a first end portion and a second end portion, the second end portion being electrically connected to the gate electrode, and gate signal for switching an on state and an off state of the transistor being applied to the first end portion;
   a diode including an anode being electrically connected to the first electrode and a cathode being electrically connected between the electric resistance and the gate electrode;
   a ferrite bead inductor being electrically connected between the electric resistance and the gate electrode; and
   a capacitor being connected in parallel with the electric resistance,
   wherein the diode is a Schottky barrier diode, the capacitor is connected in parallel to the electric resistance and the ferrite bead inductor, and the cathode is electrically connected between the ferrite bead inductor and the gate electrode.

2. The semiconductor device according to claim 1, wherein a capacitance of the capacitor is ⅓ or less of an input capacitance of the transistor.

3. The semiconductor device according to claim 1, wherein a time rate of change of an electric current flowing between the second electrode and the first electrode is 206 A (ampere)/μsec (microseconds) or more.

4. The semiconductor device according to claim 1, further comprising,
   a parasitic inductance of 10 nH or more being provided between the anode and the first electrode.

5. The semiconductor device according to claim 1, wherein the transistor is a metal oxide semiconductor field effect transistor (MOSFET) of a super junction structure using silicon.

6. The semiconductor device according to claim 1, wherein the transistor is a field effect transistor (FET) using a nitride semiconductor.

7. The semiconductor device according to claim 1, wherein the transistor is a MOSFET using silicon carbide.

8. A power conversion device, comprising:
   a semiconductor device including
   a transistor including a first electrode, a second electrode, and a gate electrode,
   an electric resistance including a first end portion and a second end portion, the second end portion being electrically connected to the gate electrode, and gate signal for switching an on state and an off state of the transistor being applied to the first end portion,
   a diode including an anode being electrically connected to the first electrode and a cathode being electrically connected between the electric resistance and the gate electrode, a ferrite bead inductor being electrically connected between the electric resistance and the gate electrode; and a capacitor being connected in parallel with the electric resistance, wherein the diode is a Schottky barrier diode, the capacitor is connected in parallel to the electric resistance and the ferrite bead inductor, and the cathode is electrically connected between the ferrite bead inductor and the gate electrode.

9. The power conversion device according to claim 8, wherein a capacitance of the capacitor is ⅓ or less of an input capacitance of the transistor.

10. The power conversion device according to claim 8, wherein a time rate of change of an electric current flowing between the second electrode and the first electrode is 206 A (ampere)/μsec (microseconds) or more.

11. The power conversion device according to claim 8, further comprising, a parasitic inductance of 10 nH or more being provided between the anode and the first electrode.

12. The power conversion device according to claim 8, wherein the transistor is a metal oxide semiconductor field effect transistor (MOSFET) of a super junction structure using silicon.

13. The power conversion device according to claim 8, wherein the transistor is a field effect transistor (FET) using a nitride semiconductor.

14. The power conversion device according to claim 8, wherein the transistor is a MOSFET using silicon carbide.

* * * * *